(12) United States Patent
Jung

(10) Patent No.: US 6,258,608 B1
(45) Date of Patent: Jul. 10, 2001

(54) METHOD FOR FORMING A CRYSTALLINE PEROVSKITE FERROELECTRIC MATERIAL IN A SEMICONDUCTOR DEVICE

(75) Inventor: Dong-jin Jung, Suwon (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/477,410

(22) Filed: Jan. 4, 2000

(30) Foreign Application Priority Data

Jan. 20, 1999 (KR) .............................................. 1999-1610

(51) Int. Cl.$^7$ .................................................. H01L 21/00
(52) U.S. Cl. .................. 438/3; 438/396; 438/691
(58) Field of Search ..................... 438/253, 396, 438/3, 48, 712, 733, 692, 690, 691; 257/295

(56) References Cited

U.S. PATENT DOCUMENTS

| | | | | |
|---|---|---|---|---|
| 5,258,093 | * | 11/1993 | Maniar .................................. | 156/626 |
| 5,728,603 | | 3/1998 | Emesh et al. ......................... | 437/235 |
| 6,051,914 | * | 4/2000 | Nishiwaki ............................ | 310/358 |

\* cited by examiner

*Primary Examiner*—Caridad Everhart
*Assistant Examiner*—Calvin Lee
(74) *Attorney, Agent, or Firm*—The Law Offices of Eugene M. Lee, PLLC

(57) ABSTRACT

A method of forming a crystalline perovskite ferroelectic layer without a non-perovskite crystalline phase, includes depositing an amorphous ferroelectric material layer on a semiconductor substrate, annealing the amorphous ferroelectric material layer, and sequentially dry etching and wet etching the top surface of the ferroelectric material layer, such that non-perovskite crystalline phase is removed from the ferroelectric material layer.

22 Claims, 11 Drawing Sheets

METHOD FOR FORMING A CRYSTALLINE PEROVSKITE FERROELECTRIC MATERIAL IN A SEMICONDUCTOR DEVICE

FIELD OF THE INVENTION

The present invention relates to a method for fabricating a ferroelectric capacitor, and more particularly to a method for removing a non-perovskite crystalline phase including pryochlore after forming a crystalline perovskite ferroelectric material in a ferroelectric capacitor process.

BACKGROUND OF THE INVENTION

Modern data processing systems require that a substantial portion of the information stored in its memory be randomly accessible to ensure rapid access to such information. Such randomly accessible devices include ferroelectric random access memories (FRAMs). FRAMs exhibit significant advantage of being nonvolatile which is achieved by virtue of the fact that a ferroelectric capacitor includes a pair of capacitor plates with a ferroelectric material between them which has two different stable polarization states which can be defined with a hysteresis loop depicted by plotting the polarization against applied voltage.

A method for using a ferroelectric material between two electrodes is taught in U.S. Pat. No. 5,728,603 entitled "Method of forming a crystalline ferroelectric dielectric material for an integrated circuit" by Emesh et al., which is hereby incorporated herein by reference.

Though the above mentioned patent relates to perovskite formation by varying post-annealing condition, formation of nonpolar pyrochlore phase formation was obtained.

Since the pyrochlore can be formed in the formation of the ferroelectric dielectric film with crystalline perovskite structure by the process of depositing a layer of amorphous ferroelectric precursor material and then annealing, it is required to remove the nonpolar(non perovskite) phase including pyrochlore following the annealing process from a top surface of the ferroelectric dielectric film.

SUMMARY OF THE INVENTION

The present invention addresses the above problem with a method of forming a ferroelectric crystalline perovskite phase.

According to an aspect of the present invention, a method of forming a crystalline perovskite ferroelectric material comprises the steps of forming a lower capacitor electrode layer on an integrated circuit substrate; depositing an amorphous ferroelectric material layer on the lower capacitor electrode layer; annealing the amorphous ferroelectric material layer to cause a phase transformation to a ferroelectric crystalline perovskite phase, wherein the annealing forms a non-perovskite crystalline phase including pyrochlore on a surface of the ferroelectric material layer of crystalline perovskite phase; selectively removing the non-perovskite crystalline phase from the surface of the ferroelectric material layer.

According to another aspect of the present invention, a method of fabricating a ferroelectric capacitor comprises the steps of forming a lower capacitor electrode on an insulating layer that covers a semiconductor substrate; depositing an amorphous ferroelectric material layer on the lower capacitor electrode; annealing the amorphous ferroelectric material layer to cause a phase transformation to a ferroelectric crystalline perovskite phase, wherein the annealing forms a non-perovskite crystalline phase including pyrochlore on a top surface of the ferroelectric material layer of crystalline perovskite phase; selectively removing the non-perovskite crystalline phase from the surface of the ferroelectric material layer; and forming an upper capacitor electrode over the ferroelectric material layer.

According to yet another aspect of the present invention, a method of forming a crystalline perovskite ferroelectric material comprises the steps of depositing an amorphous ferroelectric material layer on an integrated circuit substrate; annealing the amorphous ferroelectric material layer to cause a phase transformation to a ferroelectric crystalline perovskite phase, wherein the annealing forms a non-perovskite crystalline phase including pyrochlore on a surface of the ferroelectric material layer of crystalline perovskite phase; and removing the non-perovskite crystalline phase by dry etching.

According to yet another aspect of the present invention, a method of forming a crystalline perovskite ferroelectric material comprises the steps of depositing an amorphous ferroelectric material layer on an integrated circuit substrate; annealing the amorphous ferroelectric material layer to cause a phase transformation to a ferroelectric crystalline perovskite phase, wherein the annealing forms a non-perovskite crystalline phase including pyrochlore on a surface of the ferroelectric material layer of crystalline perovskite phase; and removing the non-perovskite crystalline phase by sequentially performing dry etching and wet etching.

According to yet another aspect of the present invention, a method of fabricating a ferroelectric capacitor comprises the steps of forming a lower capacitor electrode on an insulating layer that covers a semiconductor substrate; depositing an amorphous ferroelectric material layer on the lower capacitor electrode; annealing the amorphous ferroelectric material layer to cause a phase transformation to a ferroelectric crystalline perovskite phase, wherein the annealing forms a non-perovskite crystalline phase including pyrochlore on a top surface of the ferroelectric material layer of crystalline perovskite phase; removing the non-perovskite crystalline phase by sequentially performing dry etching and wet etching; and forming an upper capacitor electrode over the ferroelectric material layer.

According to yet another aspect of the present invention, a method of fabricating a ferroelectric capacitor comprises the steps of forming a lower capacitor electrode on an insulating layer that covers a semiconductor substrate; depositing an amorphous ferroelectric material layer on the lower capacitor electrode; annealing the amorphous ferroelectric material layer so as to cause a phase transformation to a ferroelectric crystalline perovskite phase, wherein the annealing forms a non-perovskite crystalline phase including pyrochlore on a top surface of the ferroelectric material layer of crystalline perovskite phase; selectively removing the non-perovskite crystalline phase from the surface of the ferroelectric material layer; forming an upper capacitor electrode over the ferroelectric material layer; sequentially patterning the upper capacitor electrode, the ferroelectric material layer of crystalline perovskite phase and the lower capacitor electrode, thereby forming the ferroelectric capacitor.

Various other objects, features and attendant advantages of the present invention will become more fully appreciated as the same becomes better understood when considered in conjunction with the accompanying drawings, in which like reference characters designate the same or similar parts throughout the several views.

DETAILED DESCRIPTION OF THE PREFERRED EMBODIMENTS

Applicant's Korean Patent Application No. 99-01610, filed Jan. 20, 1999, is incorporated herein by reference as if fully set forth herein.

A method for fabricating a ferroelectric capacitor and, more particularly, forming a ferroelectric dielectric film with single crystalline perovskite structure will be described with reference to the accompanying drawings. The process for forming the field oxide layer and transistor structure as presently practiced in manufacturing memory cells will be briefly described.

Figure 1A:
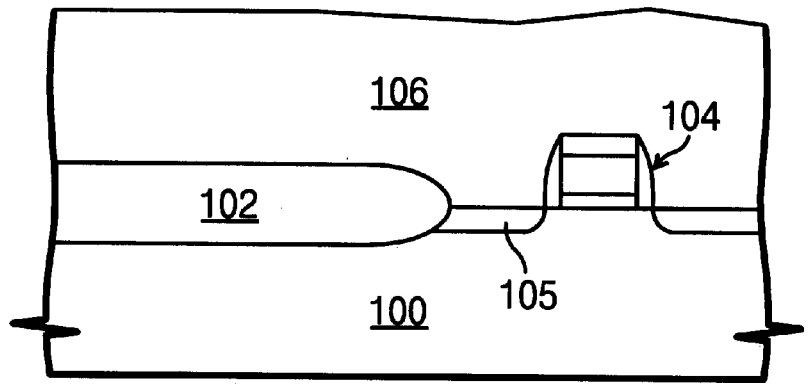
FIGS. 1A to 1E show the process steps of a novel method for fabricating a ferroelectric capacitor according to an embodiment of the present invention.

FIG. 1A illustrates, in cross-section, a portion of a semiconductor substrate 100 having already undergone several process steps in accordance with one embodiment of the present invention. It should be understood that a multitude of device isolation regions and transistors are formed on the semiconductor substrate 100, but only one such device isolation layer 102 and transistor 104 are depicted in FIG. 1A to simplify the drawing and discussion. For example, the device isolation region 102 is formed on a predetermined region of the semiconductor substrate 100 to define an active region and an inactive region. This device isolation region 102 is formed by a known method such as LOCal Oxidation of Silicon (LOCOS) or shallow trench isolation (STI) techniques. The transistor 104 includes a gate oxide, a gate electrode with a hard silicon nitride mask and a silicon nitride spacer, and a pair of source/drain regions 105. Since the transistor 104 is formed by conventional methods, the explanation thereof is omitted. An insulating layer 106 is conventionally formed over the semiconductor substrate 100 and on the transistor 104.

The fabrication of the ferroelectric capacitor and, more specifically, the formation of the ferroelectric material layer with enhanced perovskite formation without nonpolar phase such as pyrochlore and having excellent ferroelectric properties will now be described. As is well known, the ferroelectric capacitor is made of a lower electrode, a ferroelectric film and an upper electrode. A barrier layer/glue layer may be formed between the insulating layer and the lower electrode.

Figure 1B:
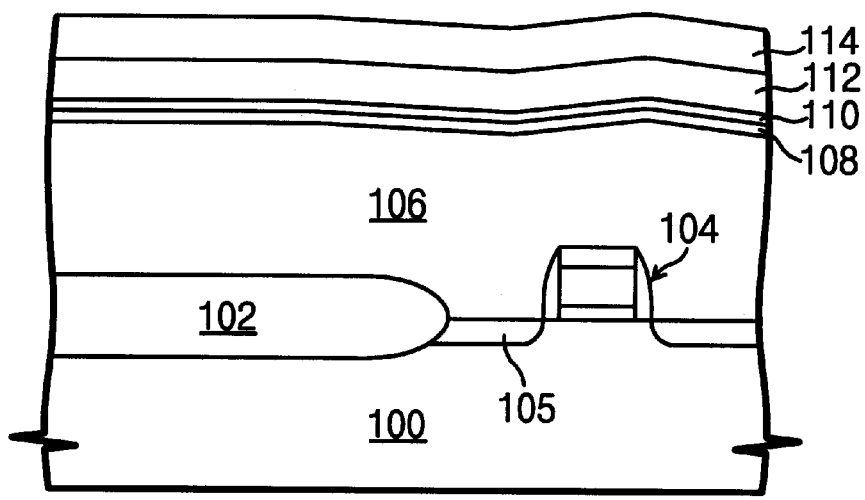

Referring now to FIG. 1B, a barrier/glue layer 108 such as $TiO_2$ is formed over insulating layer 106. This $TiO_2$ is formed to a thickness of about 500 Å by a sputtering method. The lower electrodes 110 and 112 of the ferroelectric capacitor are formed on the barrier/glue layer 108. Preferred lower electrodes are made of a conductive oxide layer ($IrO_2$) 110 and platinum 112 in this order. The conductive $IrO_2$ electrode 110 is deposited by DC magnetron sputtering with an Ir (iridium) metal target to a thickness of about 500 Å using argon gas. Annealing is then performed in an oxygen atmosphere at a temperature of about 600° C. to form stable $IrO_2$. Subsequently, platinum electrode 112 is deposited over the $IrO_2$ electrodes using a sputtering technique to a thickness of about 2,700 Å using argon gas with a platinum target. Platinum electrode 112 may also be deposited using electron beam evaporation, CVD (chemical vapor deposition), or metallorganic CVD. This platinum electrode 112 has an advantage of exhibiting a favorable crystalline structure for subsequent ferroelectric depositing and crystallization thereof. Alternatively, the lower electrode can be made from a material selected from the group consisting of platinum (Pt), iridium (ir), rhodium (Rh), and ruthenium (Ru), or selecting a combination of platinum (Pt), iridium (Ir), Rh, and ruthenium (Ru) and oxides thereof.

An amorphous layer of ferroelectric material such as lead zirconate titanate (PZT) is deposited to a thickness of about 2,500 Å on the lower platinum electrode 112 using a sol-gel method. The amorphous ferroelectric layer is then annealed to convert the amorphous precursor phase to the desired crystalline phase of ferroelectric dielectric film 114. Such annealing can be formed in a furnace or by rapid thermal annealing (RTA) at a temperature above 650° C., preferably at a temperature of about 700° C., in an oxygen ambient.

Figure 1C:
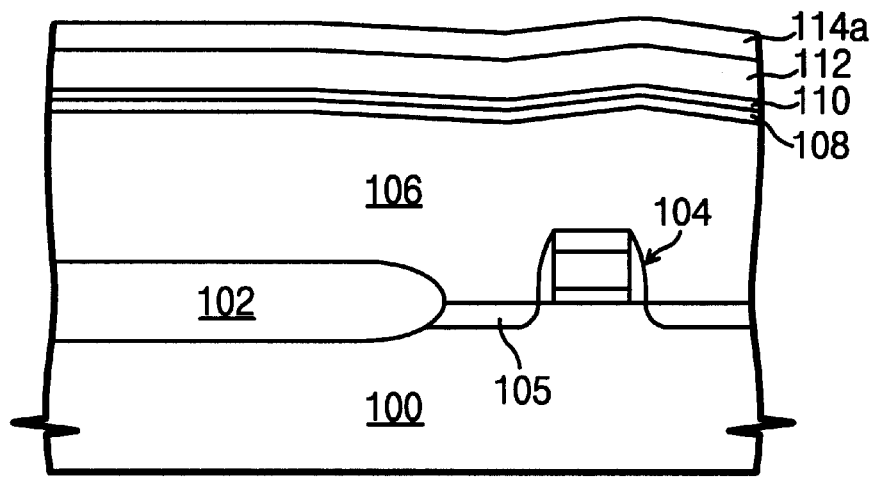

A preferred method of removing pyrochlore will now be described. After the crystallization annealing process, the above-mentioned RIE dry etching process is carried out over the entire surface of the ferroelectric material layer 114 without any mask to remove pyrochlore phase from a top surface of the ferroelectric material layer 114. RIE etching uses a mixed gas containing $Cl_2$, argon and $CF_4$ with a flow rate of about 10 sccm for about 30 seconds with an etching rate of about 960 Å/min. This dry etching process etches away about 400 to 500 Å of ferroelectric material layer and provides a smooth top surface topology. The RIE etching may undesirably produce about a 100 Å-thick surface damaged layer, i.e, an amorphous layer, due to its high plasma energy bombardment of the surface. This surface damaged layer includes a portion of amorphorized pyrochlore and amorphorized perovskite. These amorphorized layers must be removed in order to obtain the desired perovskite crystalline ferroelectric characteristics. For this reason, the RIE dry etching process, a wet etching process is carried out to uniformly remove the amorphorized layers. This wet etching process may be performed in a solution containing at least one of ethanol, acetic acid, and diluted hydrofluoric acid. A preferred solution comprises ethanol, acetic acid, and hydrofluoric acid (five hundred folds diluted in deionized water). Preferred volume ratio of ethanol:acetic acid:diluted hydrofluoric acid(five hundred folds diluted in deionized water) is 85:10:5. In this mixed solution, the acetic acid ($CH_3COOH$) is resolved into $CH_3COO^-$ and $H^+$, and the $CH_3COO^-$ removes non-perovskite crystalline phase components such as ZrO and TiO. Hydrofluoric acid(HF) is resolved into $H^+$ and $F^-$, and the $F^-$ removes PbO. Ethanol serves to allow acetic acid and hydrofluoric acid to be more easily mixed with each other. Accordingly, the aforementioned dry etching and wet etching process removes the pyrochlore phase completely from the ferroelectric material layer, and the resulting layer 114a is schematically shown in FIG. 1C.

Figure 1D:
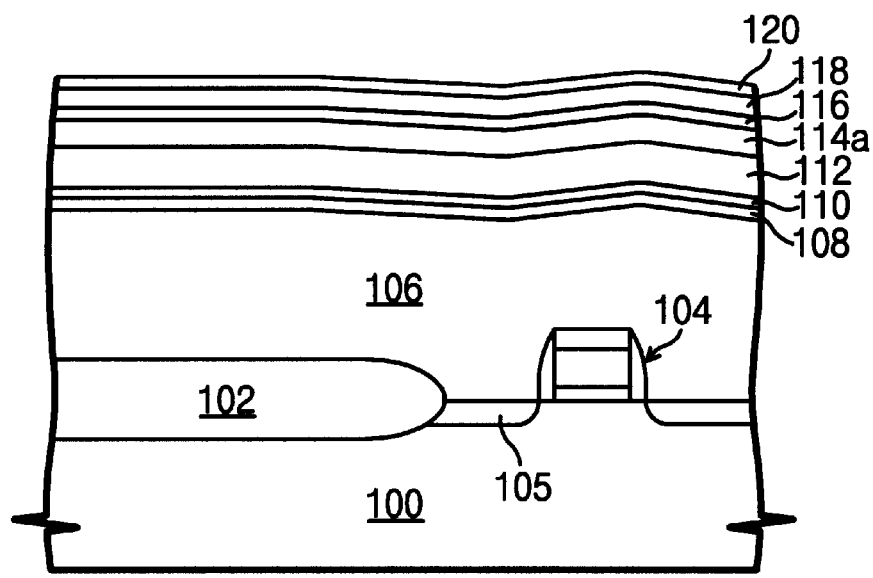
Figure 1E:
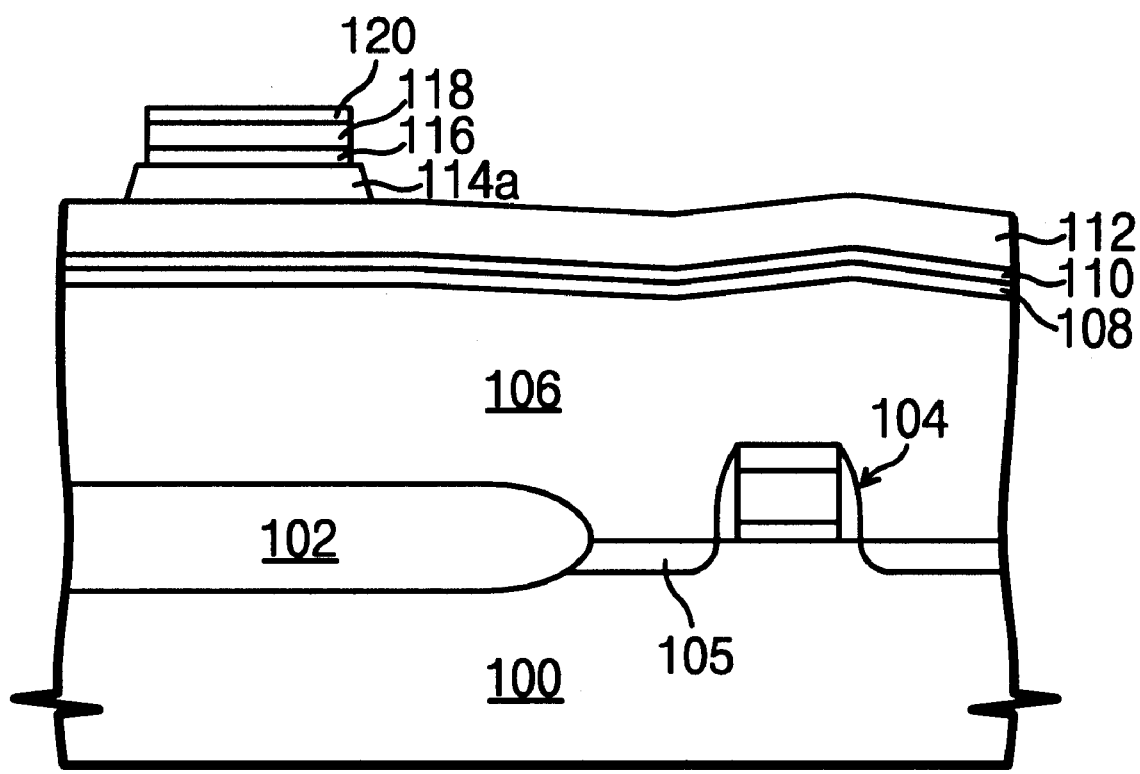
Figures 1, 2A:
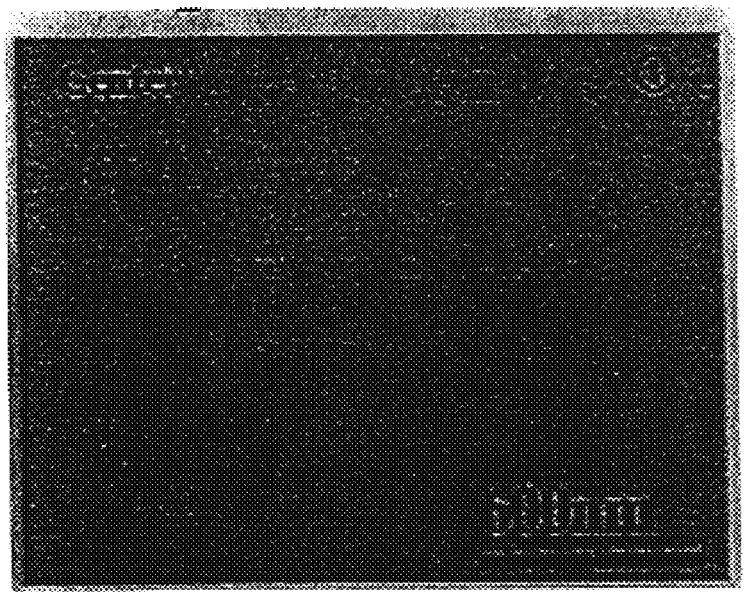
Figures 2, 2A:
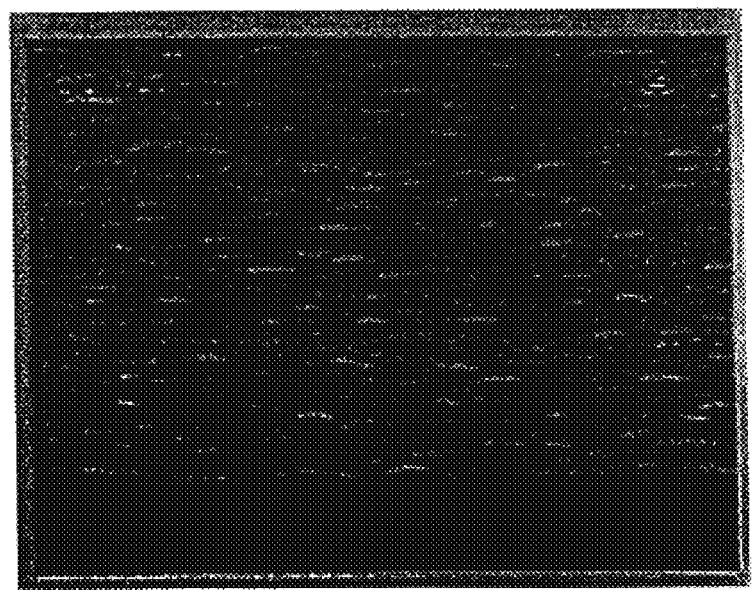
Figures 1, 2B:
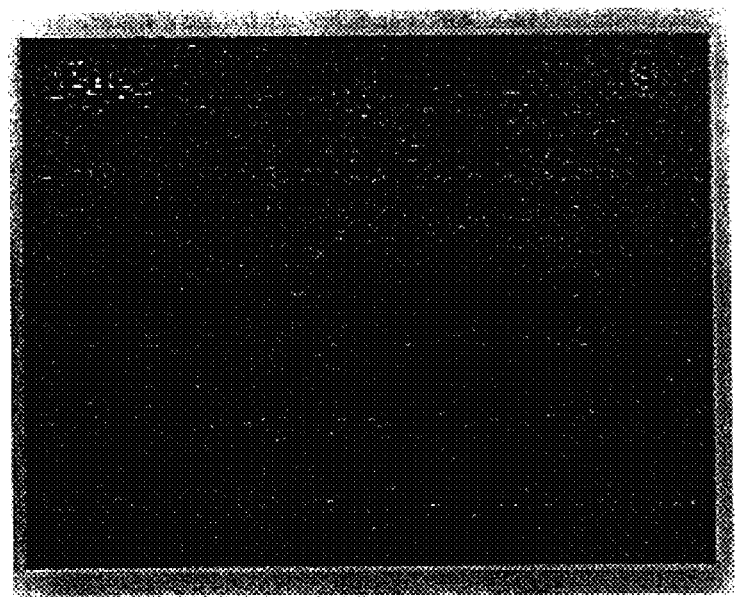
Figures 2, 2B:
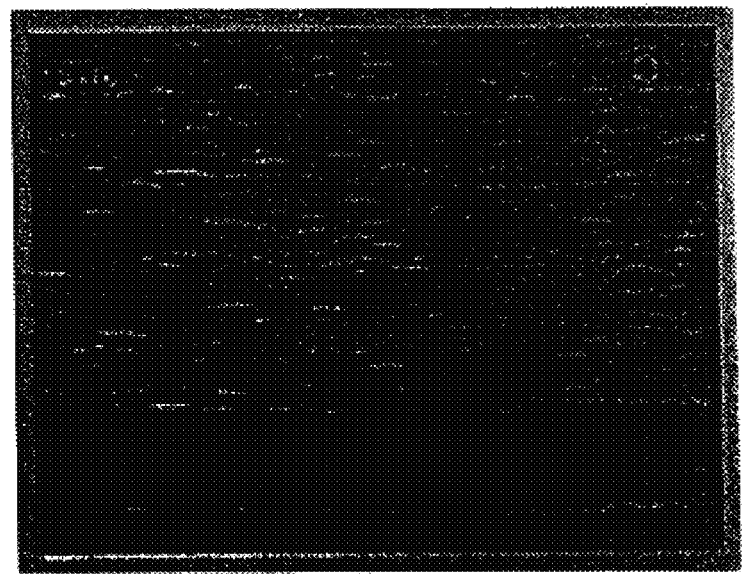
Figures 1, 3A:
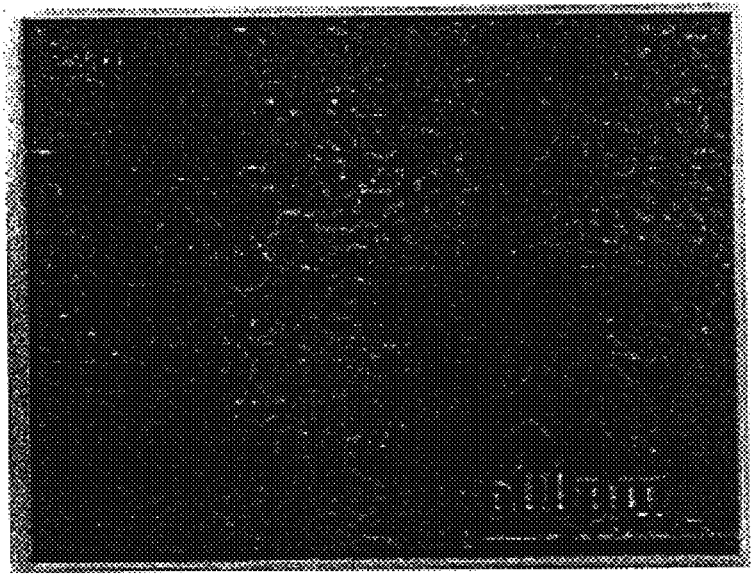
Figures 2, 3A:
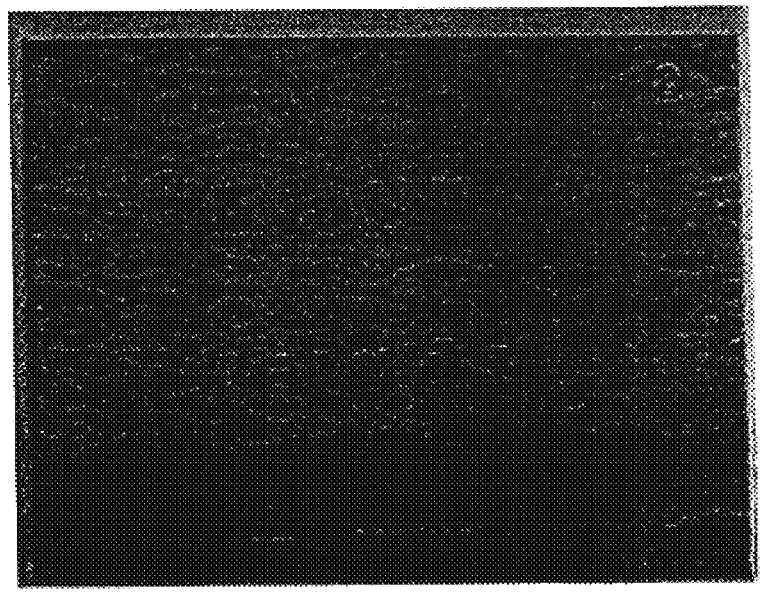
Figures 1, 3B:
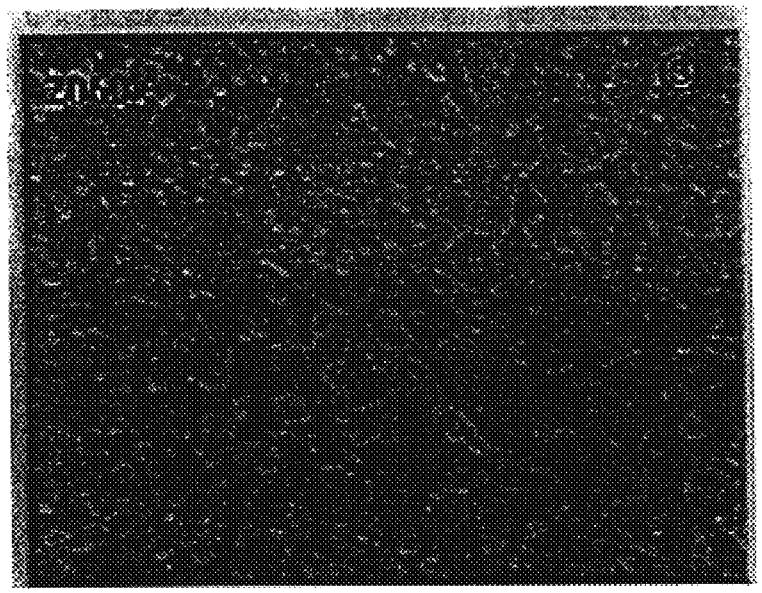
Figures 2, 3B:
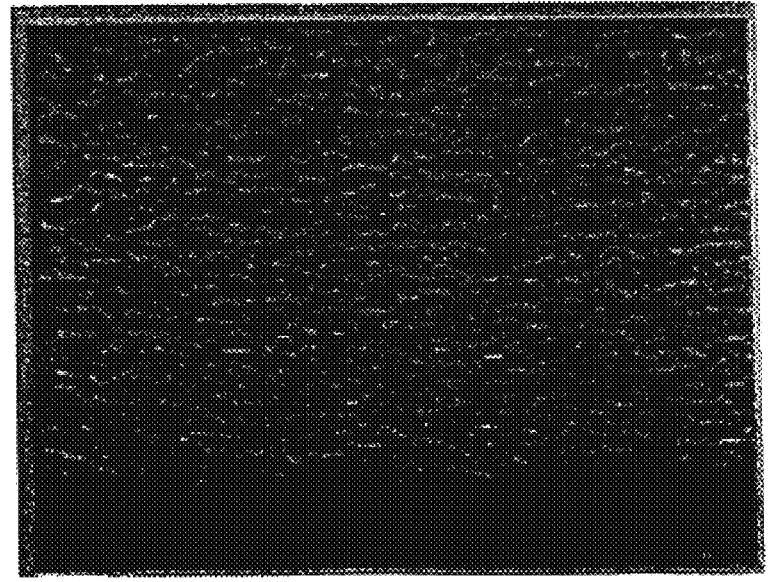
Figures 1, 3C:
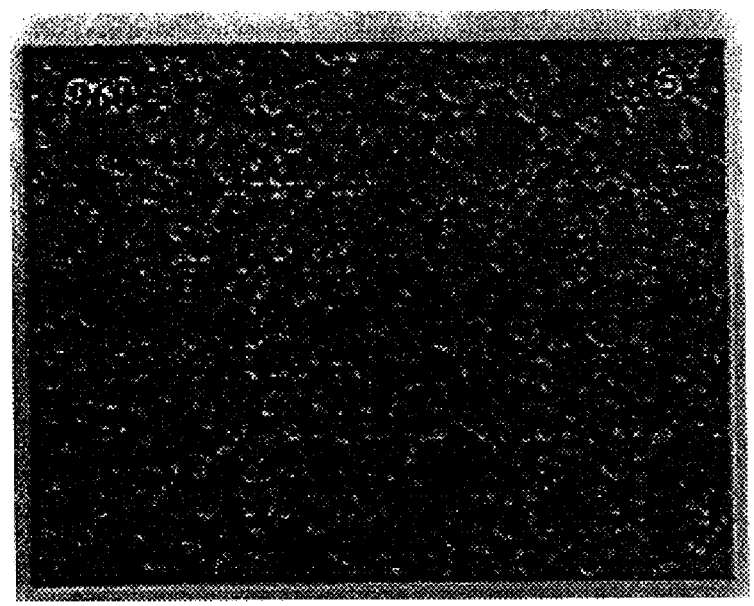
Figures 2, 3C:
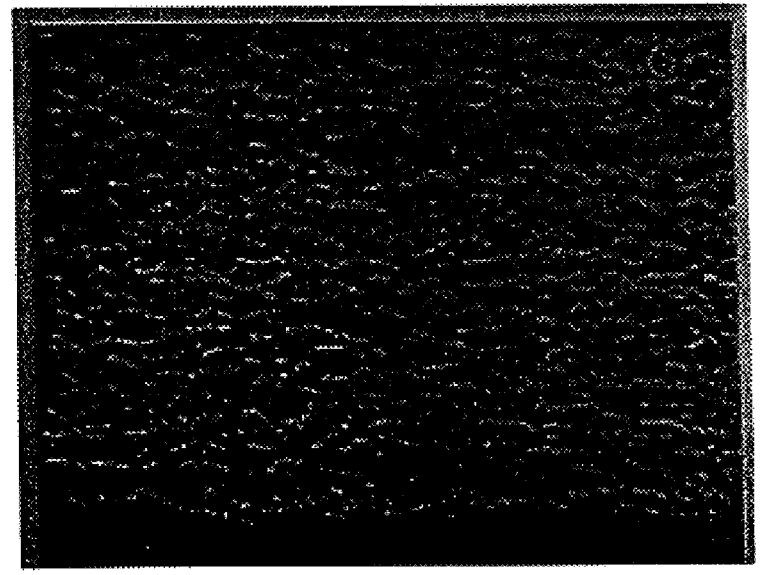
Figure 4A:
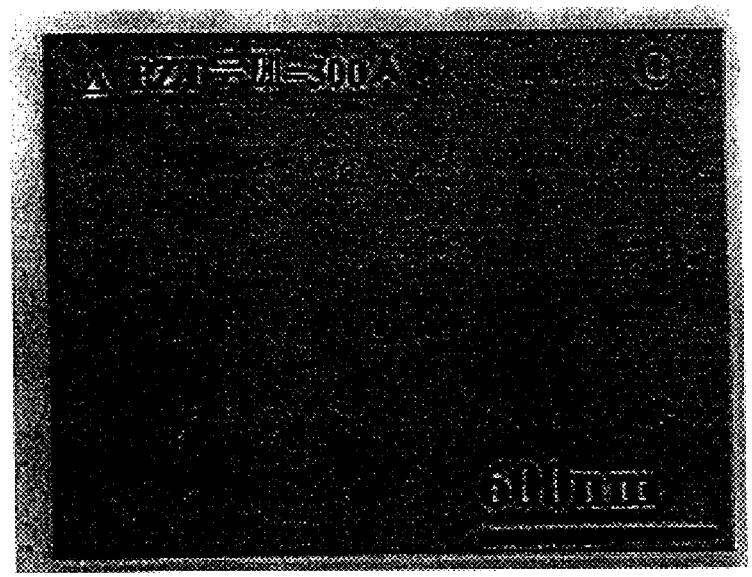
Figure 4B:
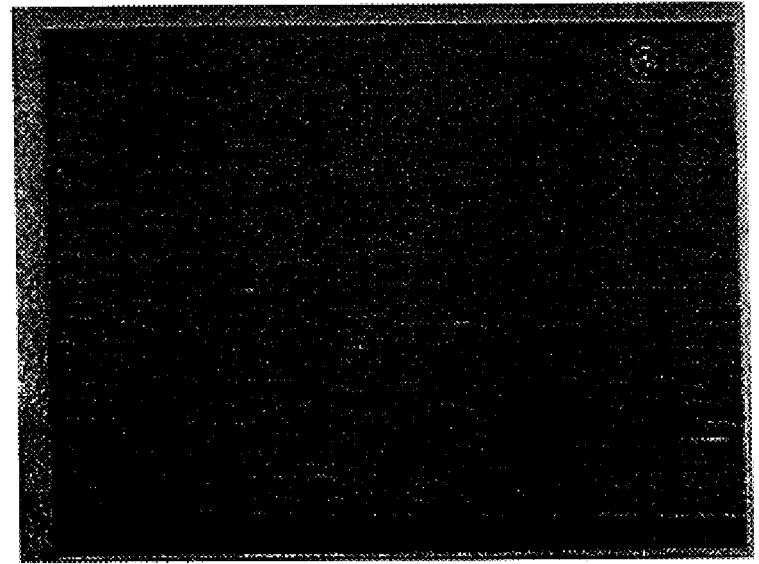
Figure 5A:
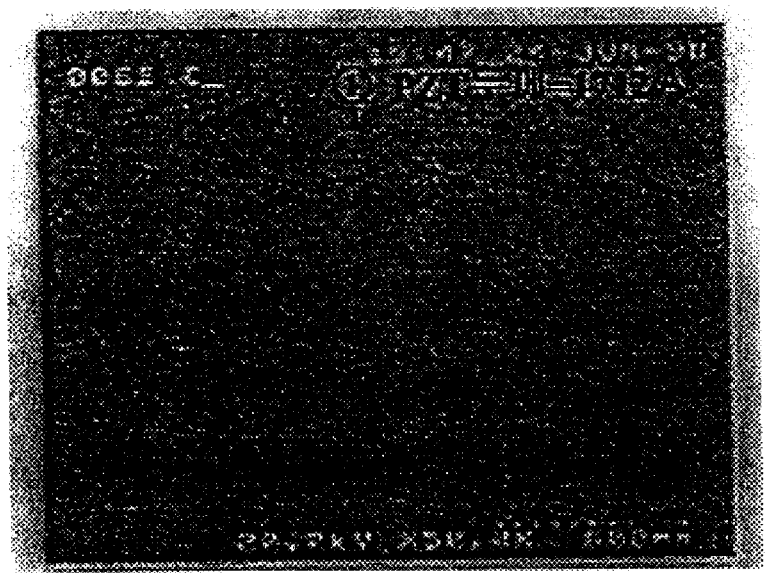
Figure 5B:
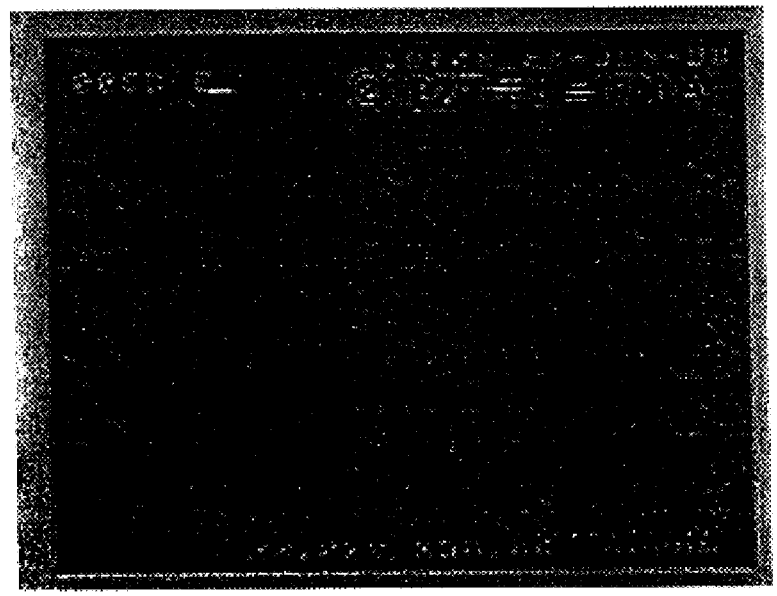
Figure 6:
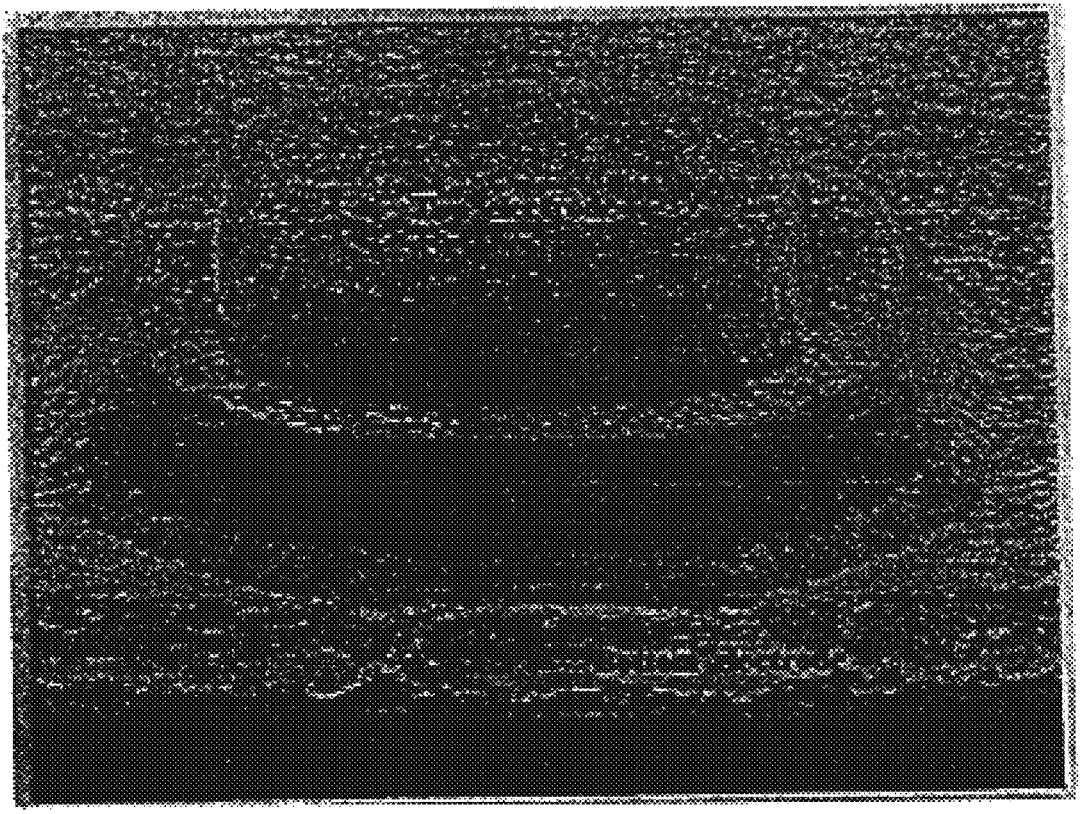

The formation of the upper electrode of the ferroelectric capacitor is now addressed and schematically shown in FIG. 1D. Preferred upper electrode 116 and 118 are made of a conductive oxide layer ($IrO_2$) 116 and metal electrode 118. The conductive $IrO_2$ electrode 116 is deposited on the ferroelectric material layer 114a to a thickness of about 300 Å by DC magnetron sputtering with an Ir metal target using argon gas. Annealing is then performed in an oxygen ambient at a temperature of about 600° C. to form a stable $IrO_2$. Subsequently, Ir (iridium) electrode 118 is deposited by a sputtering technique to a thickness of about 1,700 Å using argon gas with an iridium target. Alternatively, the upper electrode can be made of the same material as the lower electrode as mentioned above. Also, the upper electrode can be made of a single metal selected from platinum (Pt), iridium (Ir), rhodium (Rh) and ruthenium (Ru), or a combination of such metal and oxide electrodes which is made thereof Referring now to FIG. 1D, an oxide layer 120 is deposited over the upper electrode 118 and then patterned to form an oxide mask. Using this patterned oxide mask, the upper electrodes 118 and 116 and the ferroelectric material layer 114a are etched to form the ferroelectric capacitor as shown in FIG. 1E. Alternatively, skipping the oxide depositing process, a photoresist layer can be deposited over the upper electrode 118 and then patterned to obtain the desired configuration. Using this patterned photoresist layer, the upper electrode and the ferroelectric material layer are etched to form the desired ferroelectric capacitor. The etching of the upper electrodes 118 and 116 and the ferroelectric material layer 114a is performed by any suitable dry etching method, preferably RIE etching.

Although contact hole and metallization processes are performed by conventional method, these steps may be included in the preferred embodiments.

In summary, the illustrated embodiment provides a method for forming a ferroelectric crystalline perovskite phase without a nonpolar phase including metastable pyrochlore, and a method for fabricating a reliable ferroelectric capacitor.

One feature of the illustrated embodiment is removing undesirable nonpolar phase(non-perovskite crystalline phase) by wet etching, dry etching or a dry-wet etching process after crystallization annealing of an amorphous ferroelectric material layer during the ferroelectric dielectric process. Dry etching is carried out and then wet etching is carried out. The dry etching may be, for example, reactive ion etching (RIE). RIE process in a bombard mode is carried out on the entire surface of the annealed ferroelectric dielectric material layer and etches surface non-perovskite crystalline phase. This RIE process may concurrently form a surface damaged layer, i.e., amorphous layer on etched surface. To completely remove the pyrochlore and the damaged layer caused by dry etching, wet etching is carried out following the RIE etching process and at least one of ethanol, acetic acid, and diluted hydrofluoric acid may be used for wet etching. Acetic acid ($CH_3COOH$), for example, is resolved into $CH_3COO^-$ and $H^+$, and the $CH_3COO^-$ removes the non-perovskite crystalline phase component such as ZrO and TiO. Hydrofluoric acid (HF), for example, is resolved into $H^+$ and $F^-$, and the $F^-$ removes PbO. On the other hand, ethanol serves to allow acetic acid and hydrofluoric add to be mixed easily with each other. A preferred volume ratio of ethanol:acetic acid:diluted hydrofluoric acid (HF being five hundred folds diluted in deionized water) is 85:10:5.

In accordance with the illustrated embodiment, a method is provided for forming a crystalline perovskite ferroelectric material. The method includes depositing an amorphous ferroelectric material layer on an integrated circuit substrate, annealing the amorphous ferroelectric material layer to cause a phase transformation to a ferroelectric crystalline perovskite phase, wherein the annealing forms a non-perovskite crystalline phase including pyrochlore on a surface of the ferroelectric material layer of crystalline perovskite phase, and removing the non-perovskite crystalline phase.

Removing the non-perovskite crystalline phase can be carried out by dry etching, wet etching or dry-wet etching.

In accordance with another feature of the illustrated embodiment, a method includes depositing an amorphous ferroelectric material layer on an integrated circuit substrate, annealing the amorphous ferroelectric material layer to cause a phase transformation to a ferroelectric crystalline perovskite phase, wherein the annealing forms a non-perovskite crystalline phase including pyrochlore on a top surface of the ferroelectric material layer of crystalline perovskite phase, performing a dry etching process on an entire surface of the ferroelectric material layer of crystalline perovskite phase to remove the non-perovskite crystalline phase, wherein the dry etching forms a surface damaged layer, and performing a wet etching process to remove the surface damaged layer.

The dry etching is carried out by a RIE process, and the wet etching is carried out in an etching solution selected from at least one of ethanol, acetic acid, and diluted hydrofluoric acid, the diluted hydrofluoric acid being five hundred folds diluted in deionized water.

In accordance with yet another aspect of the illustrated embodiment, a method is provided for fabricating a ferroelectric capacitor. The method includes providing a semiconductor substrate having an insulating layer thereover, forming a lower capacitor electrode, depositing an amorphous ferroelectric material layer on the lower capacitor electrode, annealing the amorphous ferroelectric material layer to cause a phase transformation to a ferroelectric crystalline perovskite phase, wherein the annealing forms a non-perovskite crystalline phase including pyrochlore on a surface of the ferroelectric material layer of crystalline perovskite phase, removing the non-perovskite crystalline phase, and forming an upper capacitor electrode.

Removing the non-perovskite crystalline phase is carried out by sequentially performing dry etching and wet etching. Dry etching is carried out by a RIE process, and wet etching is carried out in an etching solution selected from at least one of ethanol, acetic acid, and diluted hydrofluoric acid, the diluted hydrofluoric acid being five hundred folds diluted in deionized water.

According to the illustrated embodiment, the non-perovskite crystalline phase may be completely removed from the surface of a ferroelectric material layer by sequentially performing dry etching and wet etching, whereby reliable ferroelectric characteristics can be obtained.

While this invention has been particularly shown and described with reference to the preferred embodiments thereof it will be understood by those skilled in the art that various changes in form and details may be made without departing from the spirit and scope of this invention.

What is claimed is:

1. A method of forming a crystalline perovskite ferroelectric material, comprising the steps of:
   depositing an amorphous ferroelectric material layer on an integrated circuit substrate;
   annealing the amorphous ferroelectric material layer so as to cause a phase transformation to a ferroelectric crystalline perovskite phase, wherein the annealing forms a non-perovskite crystalline phase including pyrochlore on a surface of the ferroelectric material layer of crystalline perovskite phase; and
   selectively removing the non-perovskite crystalline phase from the surface of the ferroelectric material layer.

2. The method according to claim 1, wherein the step of removing the non-perovskite crystalline phase is carried out by wet etching.

3. The method according to claim 2, wherein the wet etching uses an etchant including ethanol, acetic acid, and diluted hydrofluoric acid with a volume ratio of approximately 85:10:5, the hydrofluoric acid being five hundred folds diluted in deionized water.

4. The method according to claim 1, wherein the step of removing the non-perovskite crystalline phase is carried out by dry etching.

5. The method according to claim 1, wherein the step of removing the non-perovskite crystalline phase is carried out by sequentially performing dry etching and wet etching.

6. The method according to claim 5, wherein the dry etching is carried out by RIE
   using a mixture of argon, $Cl_2$, and $CF_4$ and the wet etching uses an etchant including ethanol, acetic acid, and diluted hydrofluoric acid with a volume ratio of approximately 85:10:5, the hydrofluoric acid being five hundred folds diluted in deionised water.

7. A method for forming a crystalline perovskite ferroelectric material, comprising the steps of:
   depositing an amorphous ferroelectric material layer on an integrated circuit substrate;
   annealing the amorphous ferroelectric material layer to cause a phase transformation to a ferroelectric crystalline perovskite phase, wherein the annealing forms a non-perovskite crystalline phase including pyrochlore on a top surface of the ferroelectric material layer of crystalline perovskite phase;
   dry etching the top surface of the ferroelectric material layer of the crystalline perovskite phase to remove the non-perovskite crystalline phase; and wet etching the top surface of the ferroelectric material of the crystalline perovskite phase to remove a surface layer damaged by the dry etching.

8. The method according to claim 7, further comprising selecting the ferroelectric material from an oxide of a material selected from the group consisting of Pb, Zr and Ti.

9. The method according to claim 7, wherein the dry etching is carried out by reactive ion etching (RIE).

10. The method according to claim 7, wherein the wet etching is carried out in an etching solution, the etching solution being selected from at least one of ethanol, acetic acid, and diluted hydrofluoric acid, the hydrofluoric acid being five hundred folds diluted in deionized water.

11. A method of fabricating a ferroelectric capacitor, comprising the steps of:

forming a lower capacitor electrode on an insulating layer that covers a semiconductor substrate;

depositing an amorphous ferroelectric material layer on the lower capacitor electrode;

annealing the amorphous ferroelectric material layer to cause a phase transformation to a ferroelectric crystalline perovskite phase, wherein the annealing forms a non-perovskite crystalline phase including pyrochlore on a top surface of the ferroelectric material layer of crystalline perovskite phase;

selectively removing the non-perovskite crystalline phase from the surface of the ferroelectric material layer; and forming an upper capacitor electrode over the ferroelectric material layer.

12. The method according to claim 11, further comprising selecting the ferroelectric material from an oxide of a material selected from the group consisting of Pb, Zr and Ti.

13. The method according to claim 11, wherein the step of removing the non-perovskite crystalline phase is carried out by sequentially performing dry etching and wet etching.

14. The method according to claim 13, wherein the dry etching is carried out by reactive ion etching (RIE).

15. The method according to claim 13, wherein the wet etching is carried out in an etching solution, the etching solution being selected from at least one of ethanol, acetic acid, and diluted hydrofluoric acid, the hydrofluoric acid being five hundred folds diluted in deionized water.

16. The method according to claim 11, further comprising forming a barrier layer and a glue layer over the insulating layer before forming the lower electrode.

17. A method of forming a crystalline perovskite ferroelectric material, comprising the steps of:

depositing an amorphous ferroelectric material layer on an integrated circuit substrate;

annealing the amorphous ferroelectric material layer to cause a phase transformation to a ferroelectric crystalline perovskite phase, wherein the annealing forms a non-perovskite crystalline phase including pyrochlore on a surface of the ferroelectric material layer of crystalline perovskite phase; and removing the non-perovskite crystalline phase by dry etching.

18. A method of forming a crystalline perovskite ferroelectric material, comprising the steps of:

depositing an amorphous ferroelectric material layer on an integrated circuit substrate;

annealing the amorphous ferroelectric material layer to cause a phase transformation to a ferroelectric crystalline perovskite phase, wherein the annealing forms a non-perovskite crystalline phase including pyrochlore on a surface of the ferroelectric material layer of crystalline perovskite phase; and removing the non-perovskite crystalline phase by sequentially performing dry etching and wet etching.

19. A method of fabricating a ferroelectric capacitor, comprising the steps of:

forming a lower capacitor electrode on an insulating layer that covers a semiconductor substrate;

depositing an amorphous ferroelectric material layer on the lower capacitor electrode;

annealing the amorphous ferroelectric material layer to cause a phase transformation to a ferroelectric crystalline perovskite phase, wherein the annealing forms a non-perovskite crystalline phase including pyrochlore on a top surface of the ferroelectric material layer of crystalline perovskite phase;

removing the non-perovskite crystalline phase by sequentially performing dry etching and wet etching; and forming an upper capacitor electrode over the ferroelectric material layer.

20. The method according to claim 19, wherein the dry etching is carried out by reactive ion etching (RIE).

21. The method according to claim 19, wherein the wet etching is carried out in an etching solution, the etching solution being selected from at least one of ethanol, acetic acid, and diluted hydrofluoric acid, the hydrofluoric acid being five hundred folds diluted in deionized water.

22. A method of fabricating a ferroelectric capacitor, comprising the steps of:

forming a lower capacitor electrode on an insulating layer that covers a semiconductor substrate;

depositing an amorphous ferroelectric material layer on the lower capacitor electrode; annealing the amorphous ferroelectric material layer to cause a phase transformation to a ferroelectric crystalline perovskite phase, wherein the annealing forms a non-perovskite crystalline phase including pyrochlore on a top surface of the ferroelectric material layer of crystalline perovskite phase;

selectively removing the non-perovskite crystalline phase from the surface of the ferroelectric material layer;

forming an upper capacitor electrode over the ferroelectric material layer;

sequentially patterning the upper capacitor electrode, the ferroelectric material layer of crystalline perovskite phase, and the lower capacitor electrode, thereby forming the ferroelectric capacitor.

* * * * *